United States Patent
Benedix et al.

(10) Patent No.: US 6,806,121 B2
(45) Date of Patent: Oct. 19, 2004

(54) INTERCONNECT STRUCTURE FOR AN INTEGRATED CIRCUIT AND CORRESPONDING FABRICATION METHOD

(75) Inventors: Alexander Benedix, Munich (DE); Stefan Dankowski, Haar-Ottendichl (DE); Reinhard Dueregger, Poing (DE); Wolfgang Ruf, Friedberg (DE)

(73) Assignee: Infineon Technologies AG, Munich (DE)

( * ) Notice: Subject to any disclaimer, the term of this patent is extended or adjusted under 35 U.S.C. 154(b) by 65 days.

(21) Appl. No.: 10/285,090

(22) Filed: Oct. 31, 2002

(65) Prior Publication Data

US 2003/0098467 A1 May 29, 2003

(30) Foreign Application Priority Data

Nov. 29, 2001 (DE) .......................... 101 58 564

(51) Int. Cl.[7] .............................................. H01L 21/44
(52) U.S. Cl. .................. 438/118; 427/96; 438/257; 438/268; 438/719; 438/723; 438/724
(58) Field of Search .................. 427/96; 438/257, 438/268, 719, 723, 724

(56) References Cited

U.S. PATENT DOCUMENTS 6,043,122 A * 3/2000 Liu et al. .................. 438/257
6,211,092 B1 * 4/2001 Tang et al. ................ 438/719
6,491,968 B1 * 12/2002 Mathieu et al. ............ 427/96

FOREIGN PATENT DOCUMENTS

DE 44 33 695 A1 3/1995

* cited by examiner

Primary Examiner—David Nelms
Assistant Examiner—Mai-Huong Tran
(74) Attorney, Agent, or Firm—Jenkins, Wilson & Taylor, P.A.

(57) ABSTRACT

The present invention relates to an interconnect structure for an integrated circuit (1) having a first interconnect (B1; B1'; B1"), which is composed of a plurality of interconnect sections (A11–A16; A11'–A16'; A11"–A14") lying in a first and a second interconnect plane (M0, M1); and a second interconnect (B2; B2'; B2"), which runs adjacent to the first interconnect (B1; B1'; B1") and which is composed of a plurality of interconnect sections (A21–A25; A21'–A25'; A21"–A23") lying in the first and second interconnect planes (M0, M1); the first and second interconnects (B1; B1'; B1"; B2; B2'; B2") being offset with respect to one another in the longitudinal direction in such a way that the interconnect sections (A12, A14, A16; A12', A14', A16'; A12", A14") of the first interconnect (B1; B1'; B1") which lie in the first interconnect plane (M0) run at least in sections beside the interconnect sections (A22, A24; A22'; A24'; A21", A23") of the second interconnect (B2; B2'; B2") which lie in the second interconnection plane (M1), and that the interconnect sections (A11, A13, A15; A11', A13', A15'; A11", A13") of the first interconnect (B1; B1'; B1") which lie in the second interconnect plane (M1) run at least in sections beside the interconnect sections (A21, A23, A25; A21', A23', A25'; A22") of the second interconnect (B2; B2'; B2") which lie in the first interconnect plane (M0). The invention also provides a corresponding fabrication method.

5 Claims, 11 Drawing Sheets

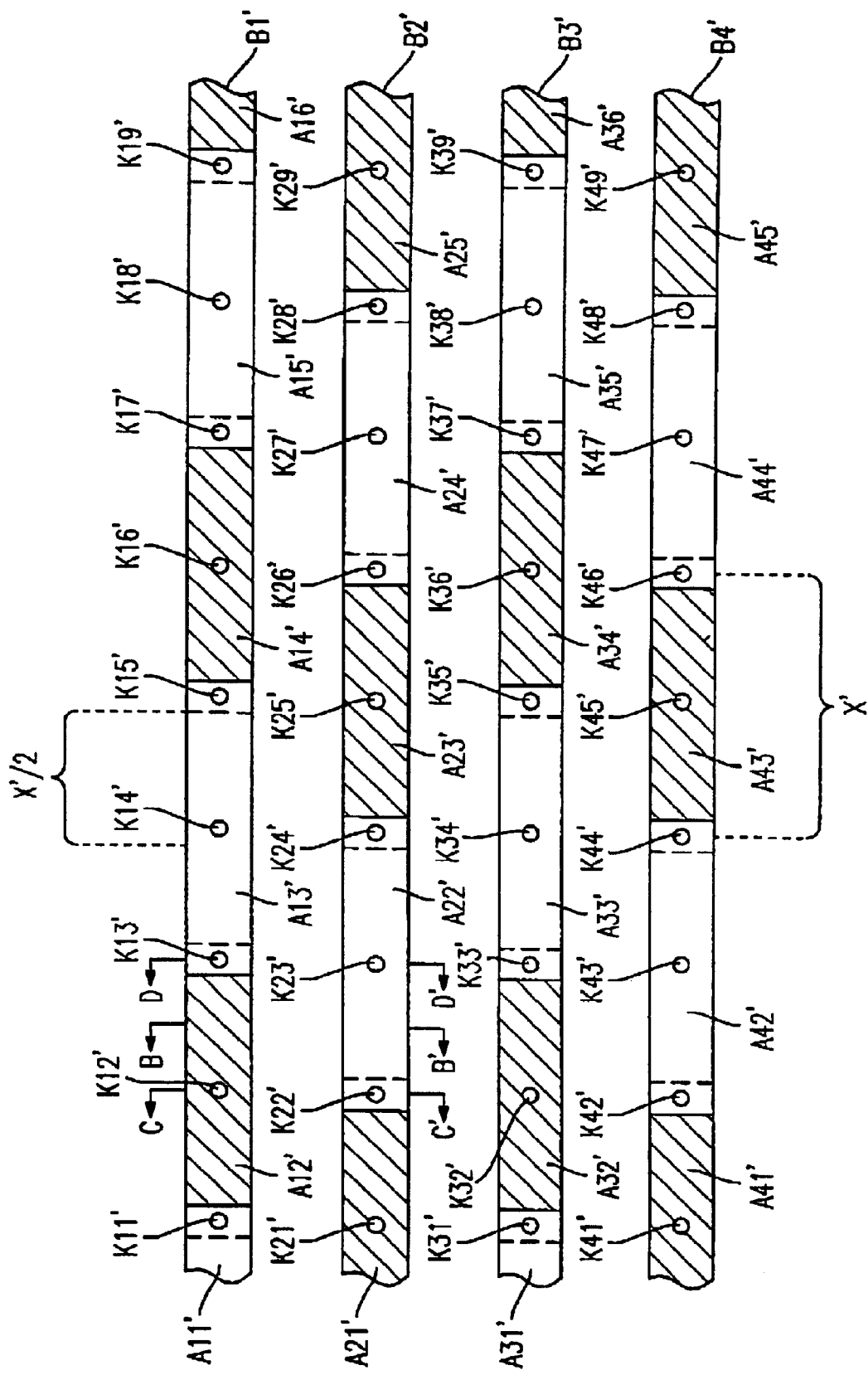

INTERCONNECT STRUCTURE FOR AN INTEGRATED CIRCUIT AND CORRESPONDING FABRICATION METHOD

TECHNICAL FIELD

The present invention relates to an interconnect structure for an integrated circuit and to a corresponding fabrication method.

BACKGROUND ART

Although applicable in principle to any desired integrated circuits, the present invention and the problem area on which it is based are explained with regard to the bit lines of integrated memory circuits using silicon technology.

In integrated semiconductor memory circuits, the individual memory cells are usually arranged in matrix form and connected to word lines running in a first direction and bit lines running perpendicularly thereto in a second direction. The addressing is effected by activation of the desired word line and the bit selection by activation of a relevant bit line.

A critical factor for the speed of the information transfer in such integrated memory circuits is the coupling capacitance between the individual bit lines. In particular, if such a coupling capacitance is high, it causes signal distortions, signal attenuations and crosstalk. In customary integrated memory circuits, in which the bit lines all lie in a single interconnect plane, so-called bit line entanglement is employed in order to reduce the signal coupling caused by the coupling capacitances.

A further possibility for reducing the coupling capacitances is to increase the distance between the individual bit lines by reducing the width/distance ratio. This possibility of improvement is limited, however, by the rise in resistance which is brought about by the narrowing of the bit lines.

SUMMARY OF THE INVENTION

Therefore, it is an object of the present invention to provide an improved interconnect structure for an integrated circuit and a corresponding fabrication method which has a lower coupling capacitance between adjacent interconnects.

According to the invention, this object is achieved by means of the interconnect structure for an integrated circuit according to claim 1.

The idea on which the present invention is based consists in dividing the individual interconnects of an interconnect structure of at least two interconnects into sections which lie in different interconnect planes. Thus, in the case of the interconnect structure according to the invention, a second interconnect plane is introduced which makes it possible to shift adjacent interconnect sections of the bit lines in a matrix vertically with respect to one another, in order thus to reduce the coupling capacitances through the distance that is increased in sections.

In this case, in particular, a first and second interconnect are offset with respect to one another in the longitudinal direction in such a way that the interconnect sections of the first interconnect which lie in the first interconnect plane run at least in sections beside the interconnect sections of the second interconnect which lie in the second interconnect plane, and that the interconnect sections of the first interconnect which lie in the second interconnect plane run at least in sections beside the interconnect sections of the second interconnect which lie in the first interconnect plane.

The subject-matters according to the invention have the advantage, inter alia, over the known solution approaches that the disturbing coupling capacitances can be significantly reduced.

Advantageous developments and improvements of the respective subject-matter of the invention can be found in the subclaims.

In accordance with one preferred development, the interconnect sections of the first interconnect and the interconnect sections of the second interconnect which lie in the first interconnect plane are in each case directly connected, one to the other, to the interconnect sections of the first interconnect and, respectively, the interconnect sections of the second interconnect which lie in the second interconnect plane.

In accordance with a further preferred development, the interconnect sections of the first interconnect and the interconnect sections of the second interconnect which lie in the first interconnect plane are preferably connected in their ends or in their center via respective first contacts to terminals integrated underneath.

In accordance with a further preferred development, the interconnect sections of the first interconnect and the interconnect sections of the second interconnect which lie in the second interconnect plane are preferably connected in their center via respective second contacts to terminals integrated underneath.

In accordance with a further preferred development, the interconnect sections of the first interconnect and the interconnect sections of the second interconnect all have an identical length.

In accordance with a further preferred development, the interconnect sections of the first interconnect and the interconnect sections of the second interconnect are offset with respect to one another approximately by the length or approximately by half the length.

In accordance with a further preferred development, a multiplicity of first and second interconnects arranged parallel to one another are provided, which are offset with respect to one another in a regular pattern.

In accordance with a further preferred development, the multiplicity of first and second interconnects arranged parallel to one another are bit lines of an integrated memory circuit.

Exemplary embodiments of the invention are illustrated in the drawings and are explained in more detail in the description below.

BRIEF DESCRIPTION OF THE DRAWINGS

In the figures:

FIG. 6 shows a diagrammatic plan view of the bit line structure of the integrated memory circuit using silicon technology in accordance with the second embodiment of the present invention;

DETAILED DESCRIPTION OF THE INVENTION

In the figures, identical reference symbols designate identical or functionally identical constituents.

Figure 1:
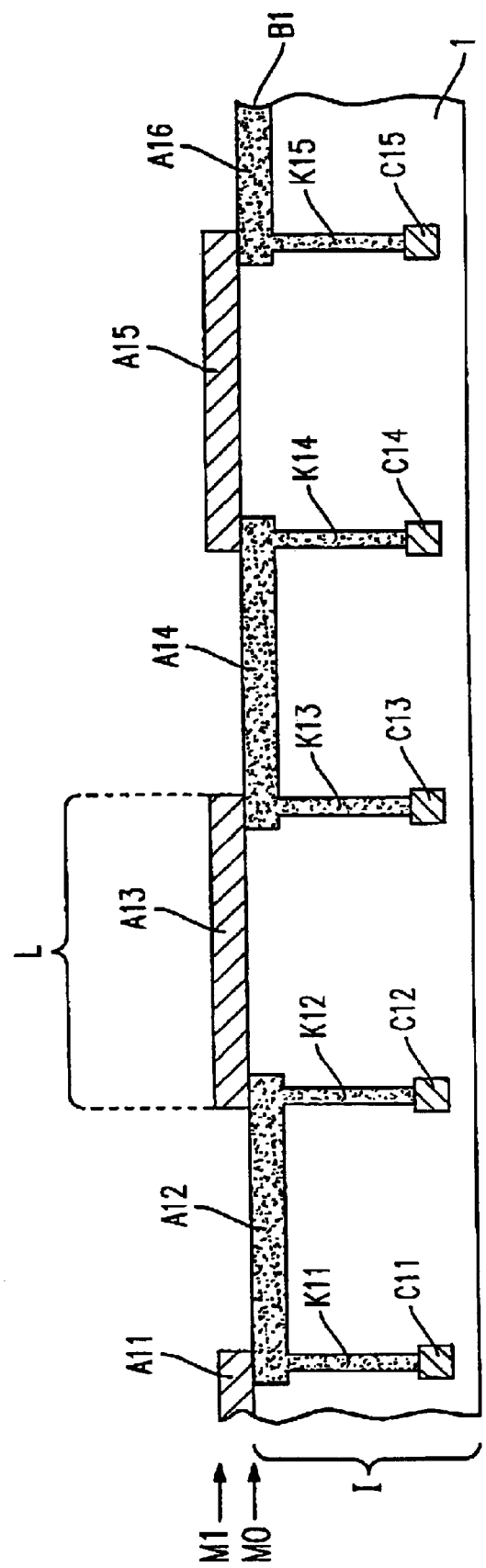
FIG. 1 shows a diagrammatic sectional illustration of a bit line structure of an integrated memory circuit using silicon technology in accordance with a first embodiment of the present invention.

FIG. 1 shows a diagrammatic sectional illustration of a bit line structure of an integrated memory circuit using silicon technology in accordance with a first embodiment of the present invention.

In FIG. 1, reference symbol B1 designates a first bit line, which is a part of the bit line structure in accordance with the first embodiment of the invention. Reference symbol 1 generally designates an integrated memory circuit whose generally known circuitry details are not shown, except for bit line terminals C11, C12, C13, C14, C15 of the individual memory cells. In particular, the bit line terminals C11 to C15 are embedded in an insulation plane I at the surface of the integrated memory circuit 1. A11, A12, A13, A14, A15, A16 designate interconnect sections of the bit line B1 which lie in two different interconnect planes M0, M1, the interconnect planes being directly connected to one another via the ends of the individual interconnect sections A11 to A16 without an intervening contact plane.

The bit line B1 is alternately composed of interconnect sections of the first (lower) metalization plane M0 and of the second (upper) metalization plane M1. Contacts K11, K12, K13, K14, K15 are provided at the ends of the interconnect sections A12, A14, A16 of the first interconnect plane M0, which contacts are connected to respective bit line terminals C11 to C15 of the memory cells of the memory circuit 1. In the example shown, all the interconnect sections A11 to A16 have the same length L.

Figure 2:
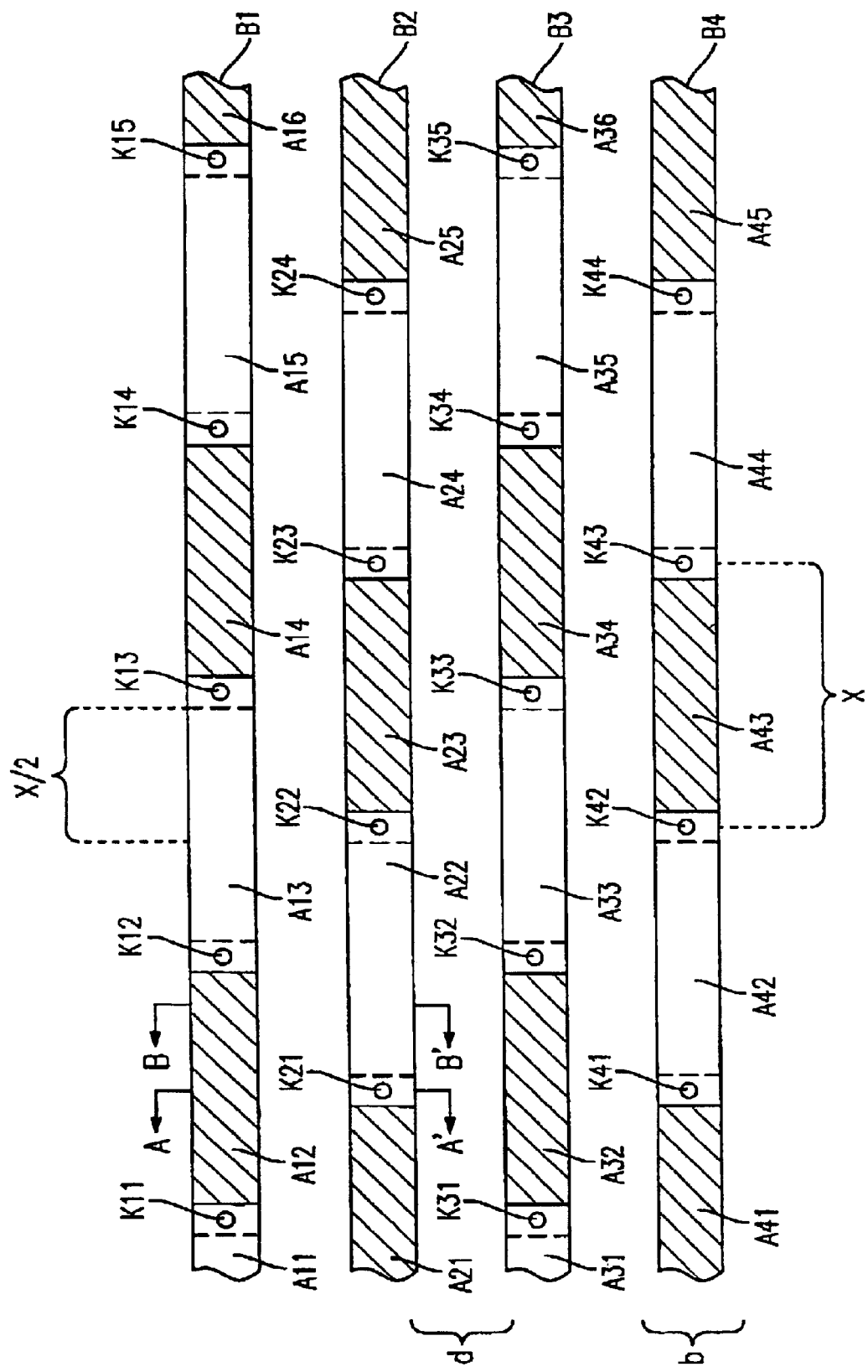
FIG. 2 shows a diagrammatic plan view of the bit line structure of the integrated memory circuit using silicon technology in accordance with the first embodiment of the present invention.

FIG. 2 shows a diagrammatic plan view of the bit line structure of the integrated memory circuit using silicon technology in accordance with the first embodiment of the present invention.

In FIG. 2, B1, B2, B3, B4 designate four bit lines of the bit line structure in accordance with the first embodiment of the invention, which bit lines run next to one another or adjacent and parallel. All the bit lines B1 to B4 have the same width b, which corresponds to the distance d between adjacent bit lines projected onto the first metalization plane M0. In the present exemplary embodiment, this is intended to be the minimum design width of the technology used.

In accordance with the description of the first bit line B1 effected above with reference to FIG. 1, the bit line B2 correspondingly has contacts K21, K22, K23, K24 and interconnect sections A21, A22, A23, A24, A25.

The bit line B3 correspondingly has contacts K31, K32, K33, K34, K35 and bit line sections A31, A32, A33, A34, A35, and the bit line B4 correspondingly has contacts K41, K42, K43, K44 and bit line sections A41, A42, A43, A44, A45.

The interconnect sections A12, A14, A16, A21, A23, A25, A32, A34, A36, A41, A43, A45 depicted in hatched fashion in FIG. 2 lie in the first interconnect plane or metalization plane M0, and the interconnect sections A11, A13, A15, A22, A24, A31, A33, A35, A42, A44 depicted without hatching lie in the second metalization plane or interconnect plane M1.

As can be seen from FIG. 2, the bit line terminals of the memory cells of the integrated memory circuit 1 which correspond to the contacts K11–K44 are arranged in rows at the same distance X, respectively adjacent rows being displaced with respect to one another by half the distance X/2 between the bit line terminals. Accordingly, the interconnect sections of adjacent bit lines are also displaced with respect to one another by this distance X/2, as indicated in FIG. 2.

What is thereby achieved is that in the partial sections in which an interconnect section in the first interconnect plane M0 is adjacent to an interconnect section in the second interconnect plane M1, the distance between these two interconnect sections is enlarged, namely by the vertical displacement, and the coupling capacitance is thus reduced compared with the case where all the interconnect sections lie in the same interconnect plane.

It should be mentioned in this connection that the ideal case occurs, of course, when interconnect sections of the first interconnect plane are adjacent to corresponding interconnect sections of the second interconnect plane over their entire length. In practice, however, with regard to the position of the bit line terminals of the memory cells and the required contacts connected thereto, it is often necessary to make a compromise with regard to reducing the coupling capacitance and the complexity of the fabrication process.

In FIG. 2, finally, the reference symbols A–A' and B–B' designate sectional lines through the first and second bit lines B1, B2, the fabrication process for the bit line structure in accordance with the first embodiment being explained below using the corresponding sectional illustration with reference to FIGS. 3 and 4.

FIGS. 3a–g show diagrammatic sectional illustrations along the line A–A' in FIG. 2 for elucidating a first embodiment of a fabrication method for fabricating the bit line structure in accordance with FIGS. 1 and 2.

Figure 3A:
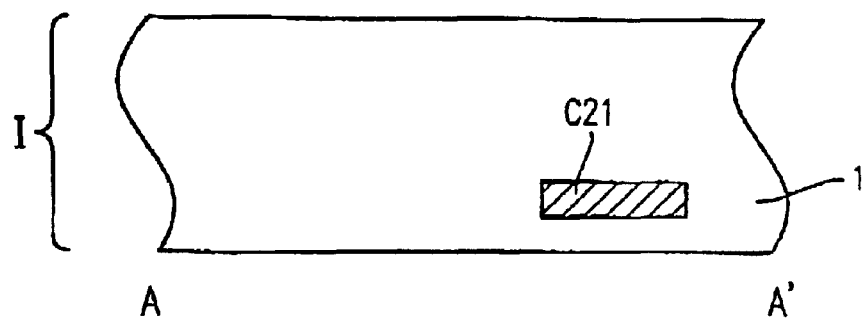
FIGS. 3a–3g show diagrammatic sectional illustrations along the line A–A' in FIG. 2 for elucidating a first embodiment of a fabrication method for fabricating the bit line structure in accordance with FIGS. 1 and 2.

In accordance with FIG. 3a, firstly the integrated memory circuit 1 is provided, which has the upper insulation plane I, in which the bit line terminals of the memory cells, for example the bit line terminal C21 in FIG. 3a, are provided.

Figure 3B:
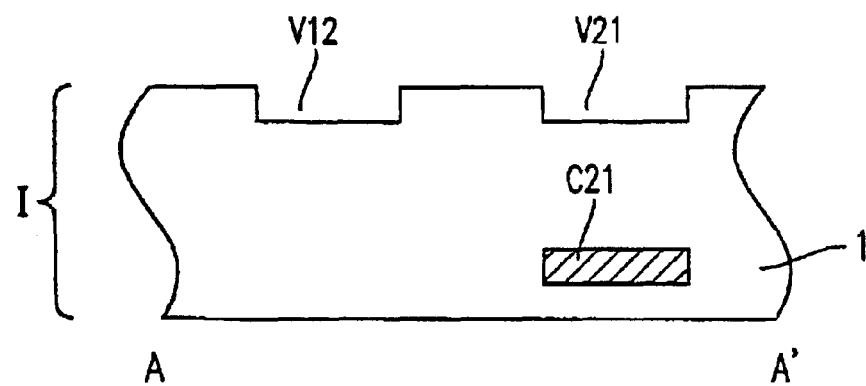

In a first process step in accordance with FIG. 3b, depressions V12, V21 are then provided in the upper region of the insulation plane I in an etching process, which depressions correspond to the interconnect sections of the first interconnect plane M0. In FIG. 3b, the depressions V12 and V21, in particular, correspond to the interconnect sections A12 and A21 in FIG. 2.

Figure 3C:
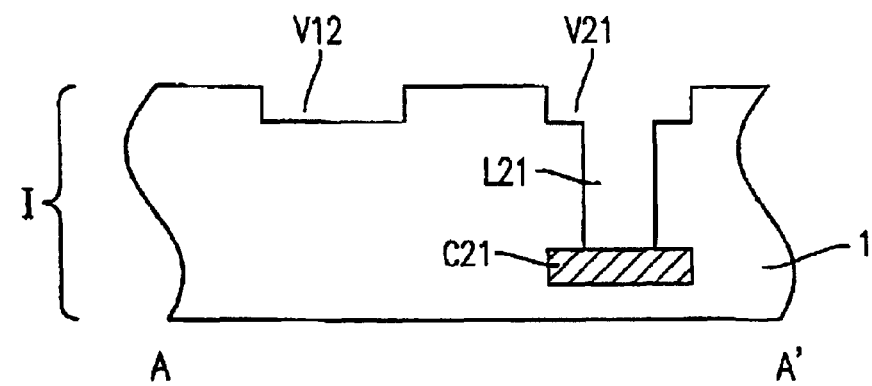

In a further process step, which is explained with reference to FIG. 3c, contact holes, such as, for example, the contact hole L21 in FIG. 3c, are then formed at the corresponding end points of the interconnect sections of the first metalization plane M0.

In the embodiment described here, the depressions V12, V21, etc. and also the contact holes L21, etc. are formed by a so-called dual Damascene process.

Figure 3D:
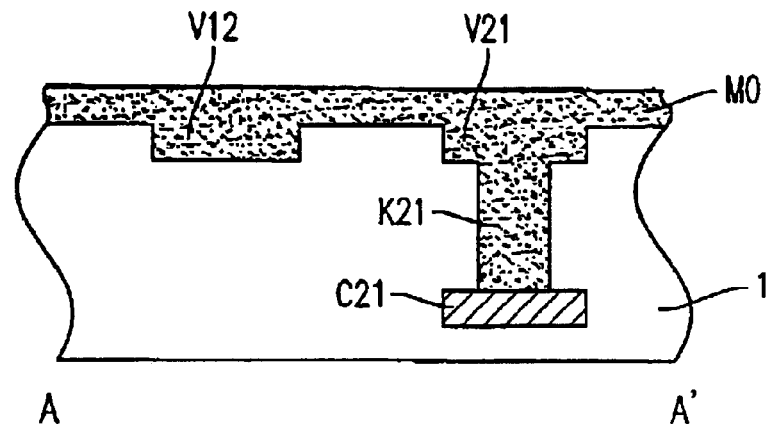

In the process step in accordance with FIG. 3d, the first interconnect plane M0, which is a tungsten metalization plane, for example, is deposited over the whole area of the resulting structure. During this deposition, the contact holes L21, etc. are filled with tungsten, and the surface of the structure is also covered with tungsten to a specific thickness.

Figure 3E:
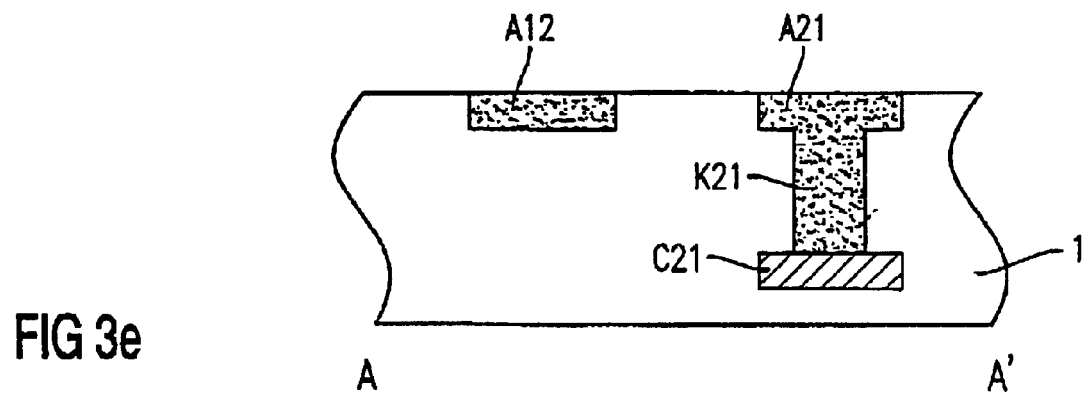

In the subsequent process step, which is explained with reference to FIG. 3e, a chemical mechanical polishing step is carried out which polishes away the tungsten provided on the surface of the structure, so that only the interconnect sections of the first metalization plane M0 remain in the depressions V12, V21, etc., in order to form the interconnect sections A12, A21, etc. of the first metalization plane M0.

Figure 3F:
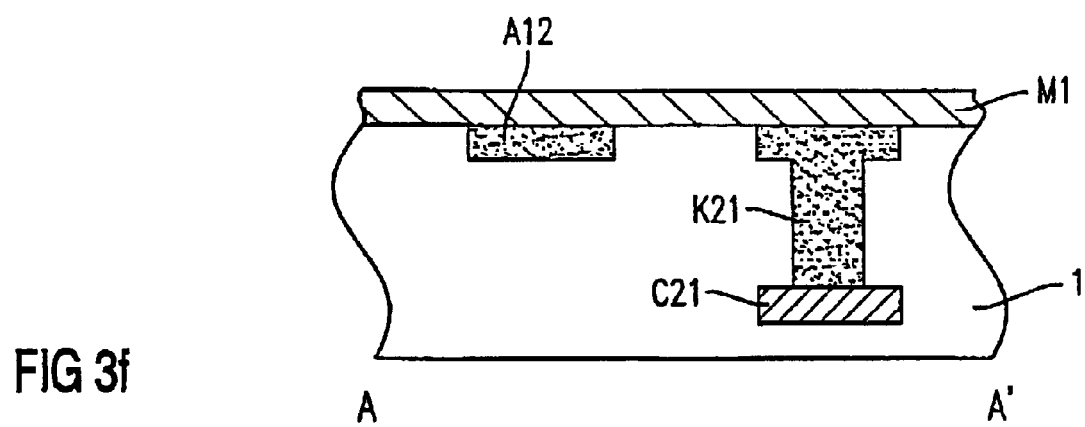

After this, with reference to FIG. 3f, the second interconnect plane or metalization plane M1, here likewise tungsten, is deposited over the whole area of the resulting structure planarized by the CMP process.

The second interconnect plane M1 is then patterned by a customary photolithographic etching step, in order to obtain the interconnect sections A22, etc. of the second interconnect plane M1, as illustrated in FIG. 2. This last leads to the structure shown in FIG. 3g.

Figure 3G:
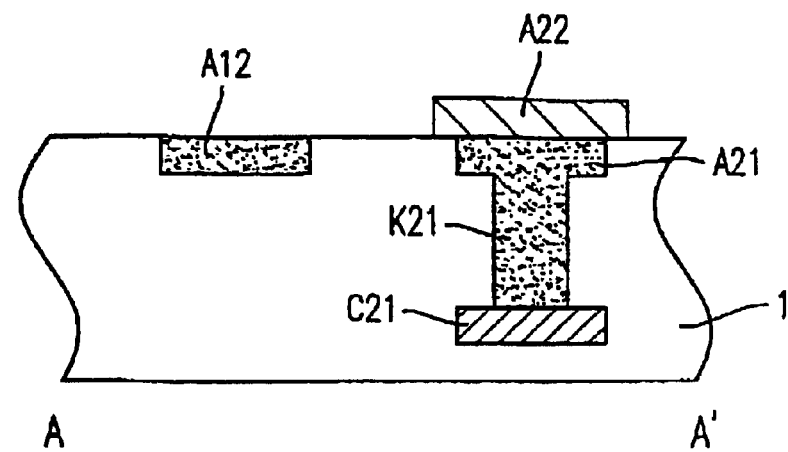
Figure 4:
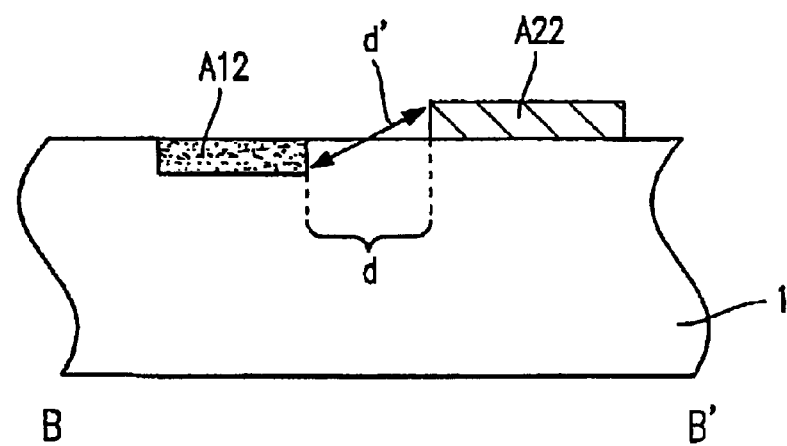
FIG. 4 shows a diagrammatic sectional illustration along the line B–B' in FIG. 2 in accordance with the process status of FIG. 3g for elucidating the first embodiment of the fabrication method for fabricating the bit line structure in accordance with FIGS. 1 and 2.

FIG. 4 is a diagrammatic sectional illustration along the line B–B' in FIG. 2 in accordance with the process status of FIG. 3g for elucidating the first embodiment of the fabrication method for fabricating the bit line structure in accordance with FIGS. 1 and 2.

As can be seen from the section along the line B–B' as shown in FIG. 4, in the regions in which interconnect sections A12 of the first interconnect plane M0 lie next to interconnect sections A22 of the second interconnect plane M1, the intervening distance is increased from the distance d in the planar case to the distance d', which lowers the coupling capacitance between the two interconnect sections A12 and A22 and correspondingly reduces the disturbances that occur.

Figure 5:
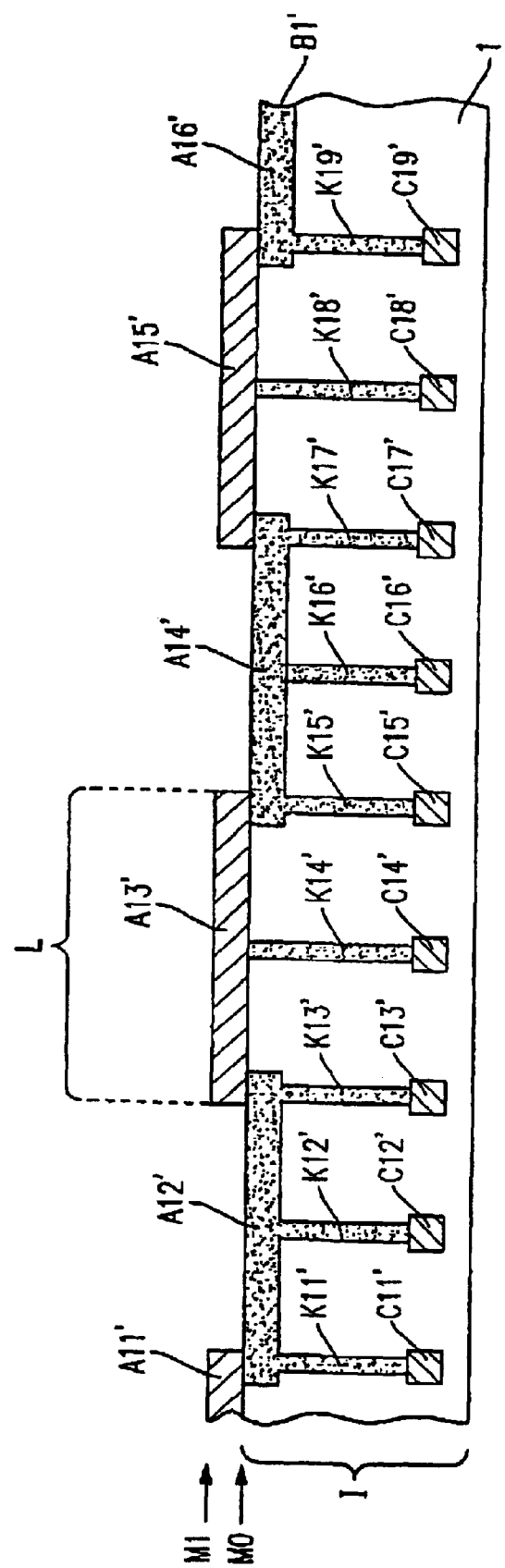
FIG. 5 shows a diagrammatic sectional illustration of a bit line structure of an integrated memory circuit using silicon technology in accordance with a second embodiment of the present invention.

FIG. 5 shows a diagrammatic sectional illustration of a bit line structure of an integrated memory circuit using silicon technology in accordance with a second embodiment of the present invention.

In FIG. 5, B1' designates a bit line of the bit line structure in accordance with the second embodiment of the present invention.

In a manner identical to that in the case of the first embodiment explained above, the interconnect sections A11', A12', A13', A14', A15' and A16' are alternately arranged in the different interconnect planes M0 and M1, respectively, and all have an identical length L.

In contrast to the first embodiment, in the case of the second embodiment, the distances between the bit line terminals C11', C12', C13', C14', C15', C16', C17', C18', C19' of the memory cells of the integrated memory circuit 1 are illustrated in differently scaled fashion and the contact connections are altered. Moreover, in the case of the second embodiment, some of the contacts K11' to K19' are also provided in the center of the interconnect sections of the first interconnect plane M0, namely the contacts K12' and K16' here. Moreover, contacts to the interconnect sections of the second interconnect plane M1 are provided here, namely the contacts K14' and K18' leading to the interconnect sections A13' and A15', respectively.

FIG. 6 shows a diagrammatic plan view of the bit line structure of the integrated memory circuit using silicon technology in accordance with the second embodiment of the present invention.

FIG. 6 shows bit lines B1', B2', B3', B4' according to the bit line structure in accordance with the second embodiment of the present invention.

The bit line B1' in FIG. 6 has already been explained with reference to FIG. 5. The remaining bit lines B2', B3', B4' are constructed analogously, and adjacent bit lines are offset with respect to one another by a length of X'/2, as indicated in FIG. 6, X' being the distance between two bit line terminals.

In accordance with the designations of the bit line B1' in FIG. 5, in the case of the bit line B2', the reference symbols K21' to K29' designate contacts and the reference symbols A21' to A25' designate interconnect sections.

In the case of the bit line B3', K31' to K39' designate contacts and the reference symbols A31' to A35' designate interconnect sections. Finally, in the case of the bit line B4', the reference symbols K41' to K49' designate contacts and the reference symbols A41' to A45' designate interconnect sections.

It is also the case with the second embodiment shown in FIG. 6 that, by virtue of the fact that in each case approximately half of an interconnect section of the first metalization plane M0 lies next to half of a further interconnect section of the second metalization plane M1, the advantage is afforded that the coupling capacitances [lacuna] considerably relative to the planar state, in which all the interconnect sections or of [sic] all the interconnects lie in one metalization plane, [lacuna] a significantly reduced coupling capacitance.

In FIG. 6, finally, the reference symbols C–C' and D–D' designate sectional lines through the first and second bit lines B1', B2', the fabrication process for the bit line structure in accordance with the first embodiment being explained below using the corresponding sectional illustration with reference to FIGS. 7 and 8.

FIGS. 7a–g show diagrammatic sectional illustrations along the line C–C' in FIG. 6 for elucidating a second embodiment of a fabrication method for fabricating the bit line structure in accordance with FIGS. 5 and 6.

Figure 7A:
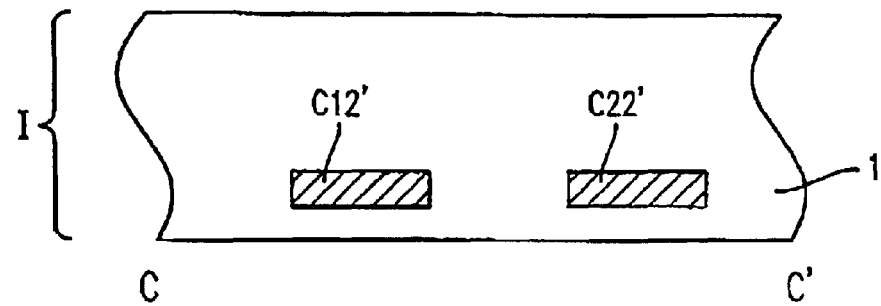
FIGS. 7a–7g show diagrammatic sectional illustrations along the line C–C' in FIG. 6 for elucidating a second embodiment of a fabrication method for fabricating the bit line structure in accordance with FIGS. 5 and 6.

In accordance with FIG. 7a, firstly the integrated memory circuit 1 with the insulation plane I located at the surface is provided, the section C–C' depicting the bit line terminals C12' and C22', but not the complete integrated memory circuit 1 for reasons of clarity.

Figure 7B:
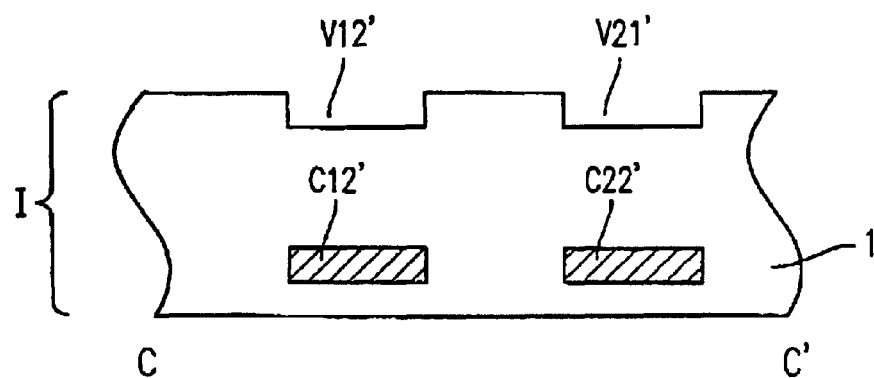

In accordance with FIG. 7b, in a first step, depressions V12' and V21' are formed in the surface of the insulation plane I by etching, which depressions correspond to interconnect sections A12', A21' of the first interconnect plane M0.

Figure 7C:
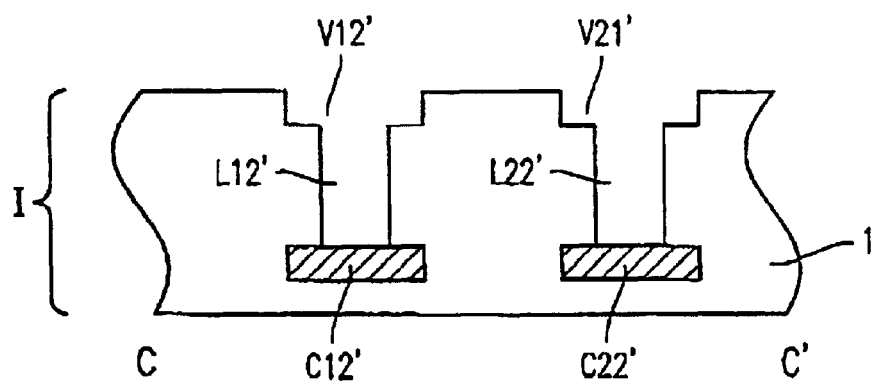

As elucidated in FIG. 7c, corresponding contact holes L12', L22' leading to the bit line terminals C12', C22', etc. are then formed, as is revealed clearly in FIG. 6, in particular.

Figure 7D:
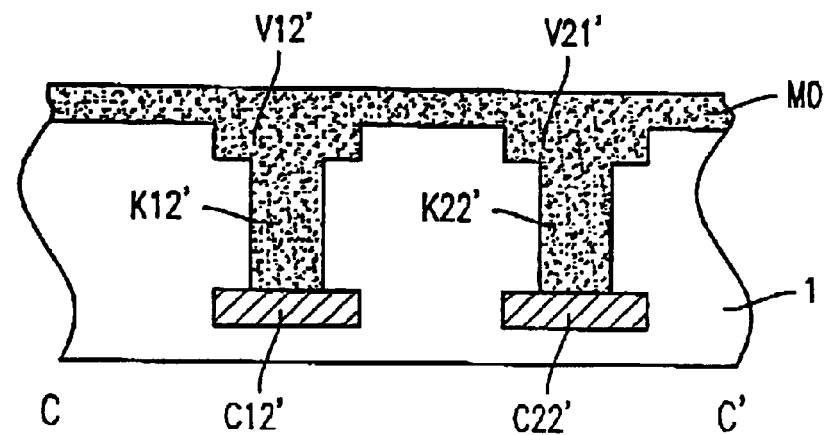

In accordance with the illustration of FIG. 7d, the first interconnect plane M0, here in the form of a tungsten metalization plane, is then deposited over the resulting structure over the resulting structure [sic], as a result of which the contact holes K12', K22', etc. are filled, and the first interconnect plane M0 covering the surface of the structure with a certain height.

Figure 7E:
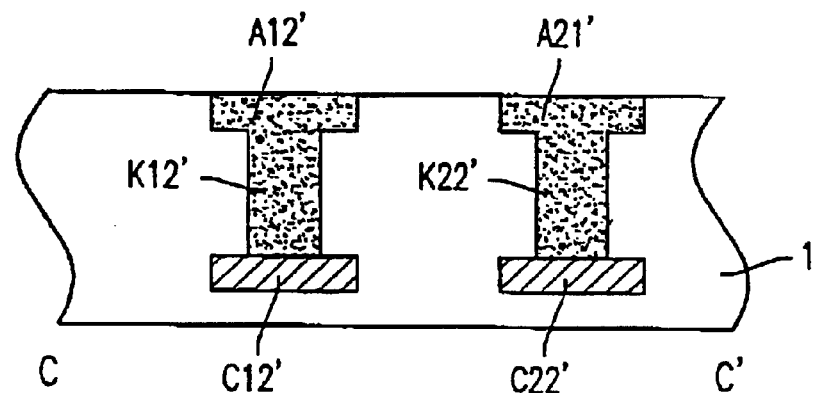

In a subsequent chemical mechanical polishing step, which is illustrated with reference to FIG. 7e, the first interconnect plane M0 is then polished back, thereby completing the interconnect sections A12', A21', etc. of the first metalization plane M0, to be precise in such a way that they are embedded in the surrounding insulating layer.

Figure 7F:
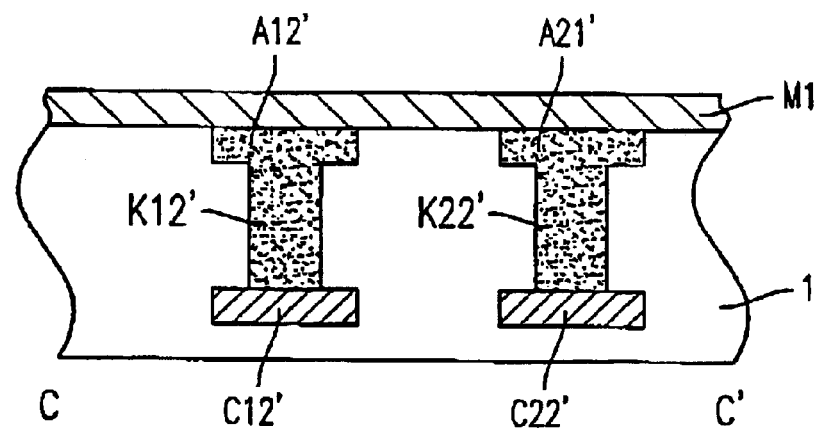

In the next process step, which is illustrated with reference to FIG. 7f, the second metalization plane M1 is deposited over the whole area of the resulting planarized structure.

Figure 7G:
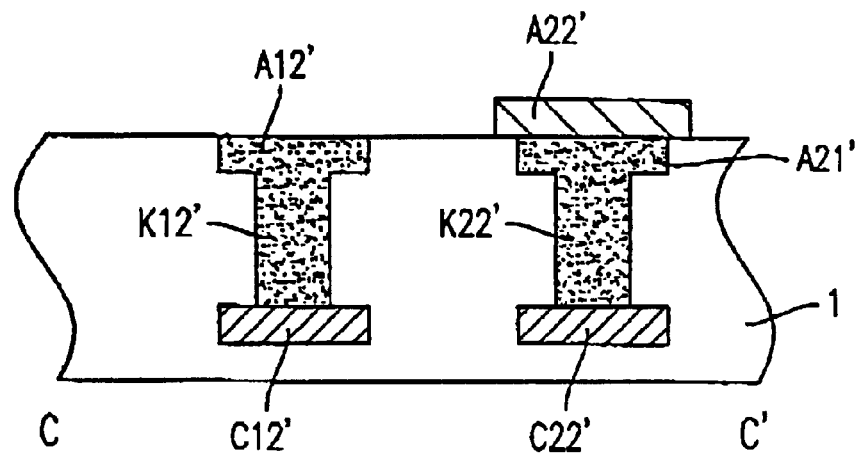

On this, as in the case of the first embodiment, a photolithographic etching step is carried out in order to form the interconnect sections A22', etc. of the second metalization plane M1, which leads to the state shown in FIG. 7g.

Figure 8:
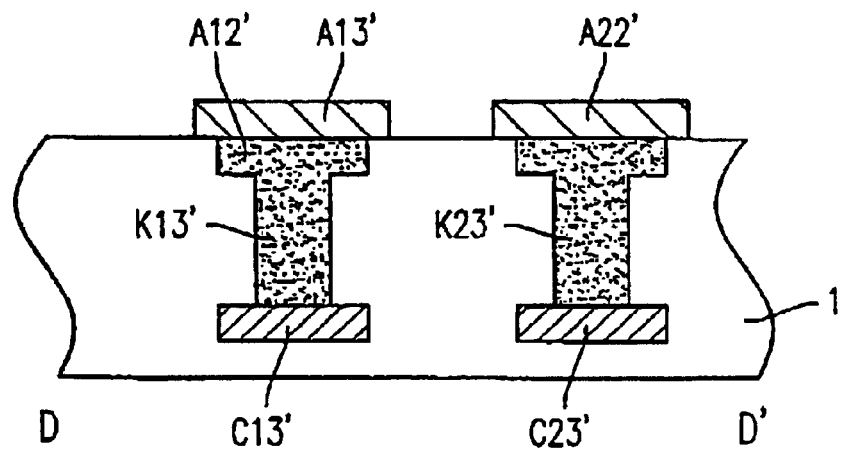
FIG. 8 shows a diagrammatic sectional illustration along the line B–B' in FIG. 2 in accordance with the process status of FIG. 7g for elucidating the second embodiment of the fabrication method for fabricating the bit line structure in accordance with FIGS. 5 and 6.

FIG. 8 is a diagrammatic sectional illustration along the line B–B' in FIG. 2 in accordance with the process status of FIG. 7g for elucidating the second embodiment of the fabrication method for fabricating the bit line structure in accordance with FIGS. 5 and 6.

What can be gathered from FIG. 8 is that the contact holes K23', etc. leading directly to the interconnect sections A22', etc. of the second metalization plane M1 are formed in the same process step as the contacts leading from the interconnect sections A12' of the first interconnect plane M0 to the corresponding bit line terminals of the memory cells of the integrated memory circuit 1. In other words, the contacts K23', etc. are formed by the metal of the first metalization plane M0.

Figure 9:
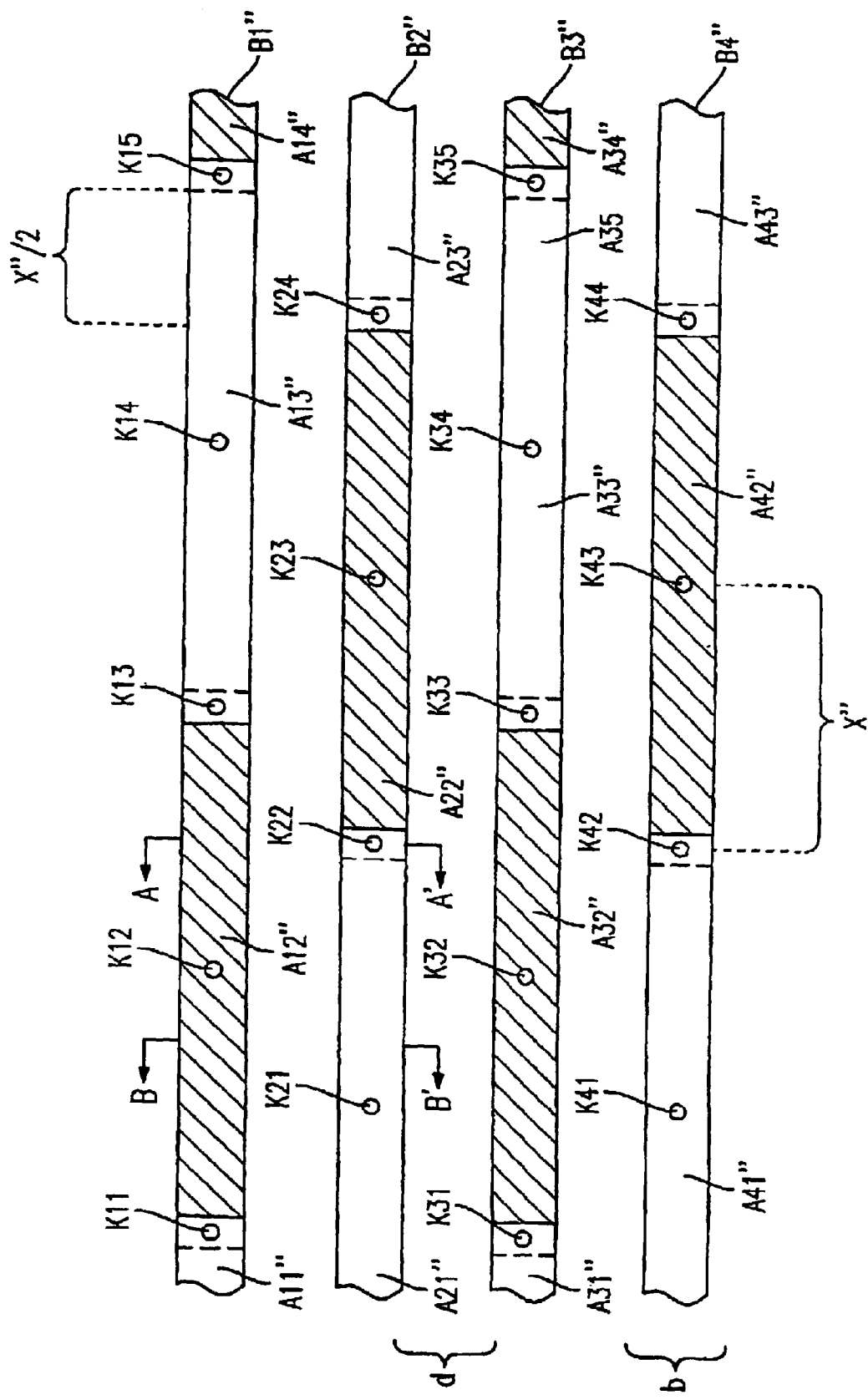
FIG. 9 shows a diagrammatic plan view of the bit line structure of the integrated memory circuit using silicon technology in accordance with a third embodiment of the present invention.

FIG. 9 shows a diagrammatic plan view of the bit line structure of the integrated memory circuit using silicon technology in accordance with a third embodiment of the present invention.

FIG. 9 shows bit lines B1", B2", B3", B4", which have the contact-connection pattern according to FIG. 5, although, in contrast to FIG. 6, the contacts are offset with respect to one another from row to row in accordance with the arrangement of FIG. 2.

The bit line [sic] B1", B2', B3', B4' are constructed analogously, and adjacent bit lines are offset with respect to one another by a length of X"/2, as indicated in FIG. 6, X" being the distance between two bit line terminals.

The reference symbols K11 to K44 are the contacts corresponding to the illustration of FIG. 2, and the reference symbols A11" to A43" designate interconnect sections which have approximately twice the length in relation to the interconnect sections of the first two embodiments.

It is also the case with the third embodiment shown in FIG. 9 that, by virtue of the fact that in each case approximately one quarter of an interconnect section of the first metalization plane M0 lies next to half of a further interconnect section of the second metalization plane M1, the advantage is afforded that the coupling capacitances [lacuna] considerably relative to the planar state, in which all the interconnect sections or of [sic] all the interconnects lie in one metalization plane, [lacuna] a significantly reduced coupling capacitance.

In FIG. 9, finally, the reference symbols A–A' and B–B' designate sectional lines through the first and second bit lines B1", B2", which have been explained above with reference to FIGS. 3 and 4.

Although the present invention has been described above using a preferred exemplary embodiment, it is not restricted thereto, but rather can be modified in diverse ways.

In particular, the explanation of the embodiments in connection with bit lines of integrated memory circuits using silicon technology is only by way of example.

Moreover, the alternating pattern of interconnect sections in the first and second metalization planes can be varied as desired.

LIST OF REFERENCE SYMBOLS

1 Circuit substrate
B1–B4; B1'–B4' Bit lines
K11–K44, K11'–K49' Contacts
A11–A45, A11'–A45'
A11"–A"–A43" Interconnect sections
C11–C15, C21, C11'–C15',
C12', C22', C13', C23' Bit line terminals
I Insulations plane
L Length of the sections
M0, M1 First, second metalization plane
X, X', X" Distance between the bit lines
d' Distance between the bit lines
b Width of the bit lines
V12, V21, V12',V21' Depressions
L21 Contact Hole

What is claimed is:

1. Fabrication method for an interconnect structure for an integrated circuit having the following steps:
 (a) provision of the integrated circuit with an insulation plane;
 (b) provision of depressions in the insulation plane in accordance with interconnect sections of a first interconnect and interconnect sections of a second interconnect which lie in the first interconnect plane;
 (c) filling of the depressions for the purpose of forming the interconnect sections of the first interconnect and the interconnect sections of the second interconnect which lie in the first interconnect plane;
 (d) whole-area deposition of the second interconnect plane onto the insulation plane and the filled depressions; and
 (e) patterning of the interconnect sections of the first interconnect and of the interconnect sections of the second interconnect in the second interconnect plane.

2. Method according to claim 1, wherein contact holes are formed in the insulation plane, which holes lead to integrated terminals located underneath, and the contact holes are filled together with the depressions for the purpose of forming corresponding contacts.

3. Method according to claim 2, wherein the formation of the depressions and of the contact holes is carried out in a dual Damascene process.

4. Method according to claim 1, wherein the filling is carried out by a whole-area deposition of the first interconnect plane and a subsequent chemical mechanical polishing step.

5. Method according to claim 1, wherein the patterning of the interconnect sections of the first interconnect and of the interconnect sections of the second interconnect in the second interconnect plane is carried out by means of a photolithographic etching step.

* * * * *